US006069395A

United States Patent [19]

Yamaguchi et al.

[11] Patent Number: 6,069,395

[45] Date of Patent: May 30, 2000

[54] CURRENT LEADS ADAPTED FOR USE WITH SUPERCONDUCTING COIL AND FORMED OF FUNCTIONALLY GRADIENT MATERIAL

[75] Inventors: Sataro Yamaguchi; Kotaro Kuroda, both of Nagoya, Japan

[73] Assignee: The Director-General of the National Institute of Fusion Science, Toki, Japan

[21] Appl. No.: 08/964,831

[22] Filed: Nov. 5, 1997

[30] Foreign Application Priority Data

Nov. 14, 1996 [JP] Japan .................................... 8-302705

[51] Int. Cl.[7] .................................................. H01L 31/058

[52] U.S. Cl. .......................... 257/468; 257/467; 257/613; 257/930; 136/203; 136/238; 136/240; 136/236.1; 62/3.2; 62/3.7; 505/700; 505/704; 505/706; 505/891

[58] Field of Search .................................... 257/930, 467, 257/468, 505, 613; 136/203, 238, 240, 236.1; 62/3.2, 3.7; 505/700, 704, 706, 891

[56] References Cited

U.S. PATENT DOCUMENTS

| | | | |
|---|---|---|---|
| 3,090,207 | 5/1963 | Smith et al. | 62/3.7 |
| 5,006,505 | 4/1991 | Skertic . | |
| 5,411,599 | 5/1995 | Horn et al. | 136/203 |
| 5,415,699 | 5/1995 | Harman | 136/238 |
| 5,802,855 | 9/1998 | Yamaguchi et al. | 62/3.2 |
| 5,834,828 | 11/1998 | Horn et al. | 257/618 |
| 5,994,637 | 11/1999 | Imanishi et al. | 136/201 |

FOREIGN PATENT DOCUMENTS

| | | | |
|---|---|---|---|
| 38 18 192 | 12/1989 | Germany . | |
| 8-236342 | 9/1996 | Japan | H01F 6/06 |

OTHER PUBLICATIONS

Patent Abstracts of Japan, vol. 97, No. 1, Jan. 31, 1997, JP 8–236342, Sep. 13, 1996.

*Primary Examiner*—Jerome Jackson, Jr.
*Assistant Examiner*—Bradley William Baumeister
*Attorney, Agent, or Firm*—Oblon, Spivak, McClelland, Maier & Neustadt, P.C.

[57] ABSTRACT

Current leads are used for connecting a power supply placed in a room-temperature environment and a superconducting coil placed in an ultralow-temperature environment. The current leads includes a first current lead and a second current lead. The first current lead is made up of a room-temperature N-type thermoelectric semiconductor, a low-temperature N-type thermoelectric semiconductor, and a high-temperature superconductor. The second current lead is made up of a room-temperature P-type thermoelectric semiconductor, a low-temperature P-type thermoelectric semiconductor, and a high-temperature superconductor. At least one of the first and second current leads is formed of a functionally gradient material.

4 Claims, 2 Drawing Sheets

CURRENT LEADS ADAPTED FOR USE WITH SUPERCONDUCTING COIL AND FORMED OF FUNCTIONALLY GRADIENT MATERIAL

BACKGROUND OF THE INVENTION

The present invention relates to superconducting-coil current leads which are used to connect a power supply placed in a room-temperature environment to a superconducting coil placed in an ultralow-temperature environment.

A strong magnetic field utilized for the confinement of plasma in a reactor, such as a nuclear fusion reactor, is generated by means of a superconducting coil. A superconducting coil used for such a purpose is kept at an ultralow temperature of 4K or so, but a power supply for exciting the superconducting coil is kept at room temperature. Therefore, a current lead, which is part of an electric circuit including the power supply and the superconducting coil, includes portions kept at room temperature and portions kept at ultralow temperature. In the current lead, the heat conduction arises from the temperature difference and Joule heat is generated by current flow, and heat travels from the room-temperature portions to the ultralow-temperature portions. The amount of heat traveling from the room-temperature portions to the ultralow-temperature portions is larger than a half of the total amount of heat entering the large-sized superconducting coil system. To ensure a stable and economic operation of the superconducting coil, it is preferable that the heat conduction from the room-temperature portions to the ultralow-temperature portions be suppressed to a possible degree.

A gas-cooled current lead, such as that shown in FIG. 1, is employed to reduce the amount of heat that enters the system through the current lead. With respect to the current lead, the mathematical product between the heat conductivity and the electrical resistance should be as small as possible. Usually, therefore, current leads are formed of normal conductors, i.e., metals such as Cu and Al. As shown in FIG. 1, a superconducting coil covered with a conduit 3 is immersed in the liquid helium 2 contained in a cryostat 1. A large number of superconducting strands 4 are led out of the conduit 3 and connected to the respective current lead strands 5. The current lead strands 5 are housed inside a current lead tube 6 and led out of the cryostat 1. The use of a large number of current lead strands is useful in increasing the ratio of the surface area to the cross sectional area.

Referring to FIG. 1, the liquid helium 2 gasifies due to the heat that enters the system through the current lead strands 5. The resultant cold helium gas passes through the current lead tube 6 and exchanges heat with reference to the current lead strands. Then, the helium gas flows out from the upper portion of the current lead tube 6. Since, in this manner, the current lead strands 5 are cooled by the cold helium gas, the heat conduction to a lower temperature region is suppressed.

However, even if the gas-cooled current lead mentioned above is employed in a large-sized heavy-current superconducting coil system, the amount of heat that enters the system from the current lead is inevitably large. Therefore, in light of the manner in which electric power is utilized in practice, the use of the gas-cooled current lead necessitates a high expense for operation or maintenance and is not desirable in the economical aspects. Hence, the amount of heat entering the system has to be reduced more efficiently.

Under these circumstances, more and more researches are recently made to provide a current lead wherein a normal conductor is employed in a room-temperature region and a high-temperature superconductor (HTS) is employed in an ultralow-temperature region. An example of such a current lead is shown in FIG. 2. Referring to this FIGURE, a power supply 100 placed in a room-temperature environment and a superconducting coil 200 placed in an ultralow-temperature environment are connected together by means of a current lead 11, which is obtained by joining a normal conductor 12 and a high-temperature superconductor 13 together. A high-temperature superconductor recently developed does not have an electric resistance even at the temperature of a liquid nitrogen (77K) or thereabouts, as long as it is placed in a low magnetic field. This being so, the high-temperature superconductor allows conduction of a large amount of current, and yet it does not generate heat owing to superconduction. In addition, where it is formed of a Bi-based material (Bi-2223, Bi-2212) or a Y-based material, the heat conductivity which it has at a temperature of 100K to 10K is about 1/1,000 of that of copper. Due to these characteristics, the use of the high-temperature superconductor is effective in suppressing the heat which may enter the system by way of the current lead 11.

The inventor of the present invention previously proposed a current lead that utilized a Peltier effect (an example of such a current lead is shown in FIG. 3), and named it a Peltier current lead. This Peltier current lead is made up of a first current lead 21*a* and a second current lead 21*b*, the former being obtained by joining an N-type thermoelectric semiconductor 22*a*, a normal conductor 23 and a high-temperature superconductor 24 together, and the latter being obtained by joining a P-type thermoelectric semiconductor 22*b*, a normal conductor 23 and a high-temperature superconductor 24 together. By means of the first and second current leads 2la and 21*b*, the Peltier current lead connects a power supply 100 located in a room-temperature environment and a superconducting coil 200 located in an ultralow-temperature environment. The N- and P-type thermoelectric semiconductors 22*a* and 22*b* are formed of a BiTe-based material or a BiTeSb-based material. In the current circuit formed by the Peltier current lead, a current from the power supply 100 flows first through the first current lead 21*a*, then through the superconducting coil 200, then through the second current lead 21*b*, and then returns to the power supply 100.

When a current is supplied to the N- and P-type thermoelectric semiconductors 22*a* and 22*b* of the current leads 21*a* and 21*b*, as indicated by the arrows shown in FIG. 3, the thermoelectric semiconductors 22*a* and 22*b* exhibit the Peltier effect and thus function as a heat pump. Thus, heat is conveyed from the low-temperature region to the room-temperature region. In the case where the thermoelectric semiconductors 22*a* and 22*b* are formed of a BiTe-based material or a BiTeSb-based material, they can cool an object to as low as 200K or thereabouts in the state where there is no heat load. As a result, those portions of the current leads 21*a* and 21*b* which are located in the room-temperature environment are cooled, and heat is not transmitted to the ultralow-temperature portions of the system.

The high-temperature superconductor 24 is used at a temperature lower than that of liquid nitrogen. In practice, however, it cannot be cooled to this low temperature if the thermoelectric semiconductors are formed of a BiTe-based or BiTeSb-based material. This is why the normal conductors 23 are inserted between the thermoelectric semiconductors 22*a*, 22*b* and the high-temperature superconductors 24. At room temperature or thereabouts, the thermoelectric semiconductors formed of the BiTe-based or BiTeSb-based material has a heat conductivity which is about 1/200 of that of copper. Hence, heat is not transmitted to the ultralow-temperature region even when no current is supplied.

Even when the current leads shown in FIGS. 2 and 3 are employed, the amount of heat transmitted to the ultralow-temperature region through the normal conductors cannot be neglected. It is therefore desired that the heat transmitted to the ultralow-temperature region by way of the current leads of the superconducting coil be reduced further.

BRIEF SUMMARY OF THE INVENTION

An object of the present invention is to provide superconducting-coil current leads formed of a functionally gradient material (FGM) that is capable of remarkably reducing the amount of heat transmitted from the room-temperature region to the ultralow-temperature region.

The superconducting-coil current leads provided by the present invention are formed of a functionally gradient material and used to connect a power source placed in the room-temperature environment and the superconducting coil placed in the ultralow-temperature environment. To attain the object mentioned above, the current leads include a first current lead and a second current lead. The first current lead is made up of a room-temperature N-type thermoelectric semiconductor, a low-temperature N-type thermoelectric semiconductor (alternatively, a normal conductor), and a high-temperature superconductor. The second current lead is made up of a room-temperature P-type thermoelectric semiconductor, a low-temperature P-type thermoelectric semiconductor (alternatively, a normal conductor), and a high-temperature superconductor. At least one of the first and second current leads is formed of a functionally gradient material. The first and second leads are connected in such a manner that a current from the power source flows through the first current lead, the superconducting coil and the second current lead in the order mentioned and then returns to the power source.

The "low" temperature in the term "low-temperature thermoelectric semiconductor" is used herein to represent a temperature which is lower than the room temperature and is higher than the ultralow-temperature, i.e., the operating temperature of the high-temperature superconductor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A description will be given of materials used for forming the current leads of the present invention.

Room-temperature N- and P-type thermoelectric semiconductors (which are adapted for use at room temperature) are formed of either a BiTe-based material or a BiTeSb-based material. Examples of such materials are $Bi_2Te_3$ and $(BiSb)_2Te_3$. In the case where thermoelectric semiconductors formed of such materials are used as Peltier elements, a satisfactory cooling effect is attained in the temperature range approximately between the room temperature and 200K.

Low-temperature N- and P-type thermoelectric semiconductors (which are adapted for use at low temperature) are formed of BiSb-based materials. In the case where thermoelectric semiconductors formed of such materials are used as Peltier elements, a satisfactory cooling effect is attained in the temperature range approximately between 200K and 77K (77K: the temperature of liquid nitrogen).

The thermoelectric semiconductors become "N" in conductivity if impurities such as $SbI_3$ are doped, and become "P" in conductivity if impurities such as $PbI_3$ are doped. In addition, they can be controlled in conductivity type ("N" or "P") by slightly varying the amount of each element with reference to the stoichiometric ratio.

According to the present invention, one of the low-temperature N- and P-type thermoelectric semiconductors may be replaced with a normal conductor, such as Cu and Al. In other words, the present invention works in a satisfactory manner by providing only one low-temperature thermoelectric semiconductor for either the first current lead (N-type thermoelectric semiconductor) or the second current lead (P-type thermoelectric semiconductor). It should be noted that in at least one of the first and second current leads, the room-temperature thermoelectric semiconductor and low-temperature thermoelectric semiconductor may be different in cross section and/or length in accordance with the property have and the characteristics required for them.

The high-temperature superconductor is formed of a Bi-based material such as Bi—Sr—Ca—Cu—O (Bi-2223, Bi-2212), a Y-based material such as Y—Ba—Cu—O (Y-123), Tl-based material such as Tl—Ba—Ca—Cu—O (Tl-2223), or the like.

According to the present invention, at least one of the first and second current leads is formed of a functionally gradient material. For example, the room-temperature thermoelectric semiconductor is formed of either a BiTe-based material or a BiTeSb-based material, the low-temperature thermoelectric semiconductor is formed of a BiSb-based material, and the high-temperature superconductor is formed of a Bi-based material.

A preferred embodiment of the present invention will be explained.

Figure 1:
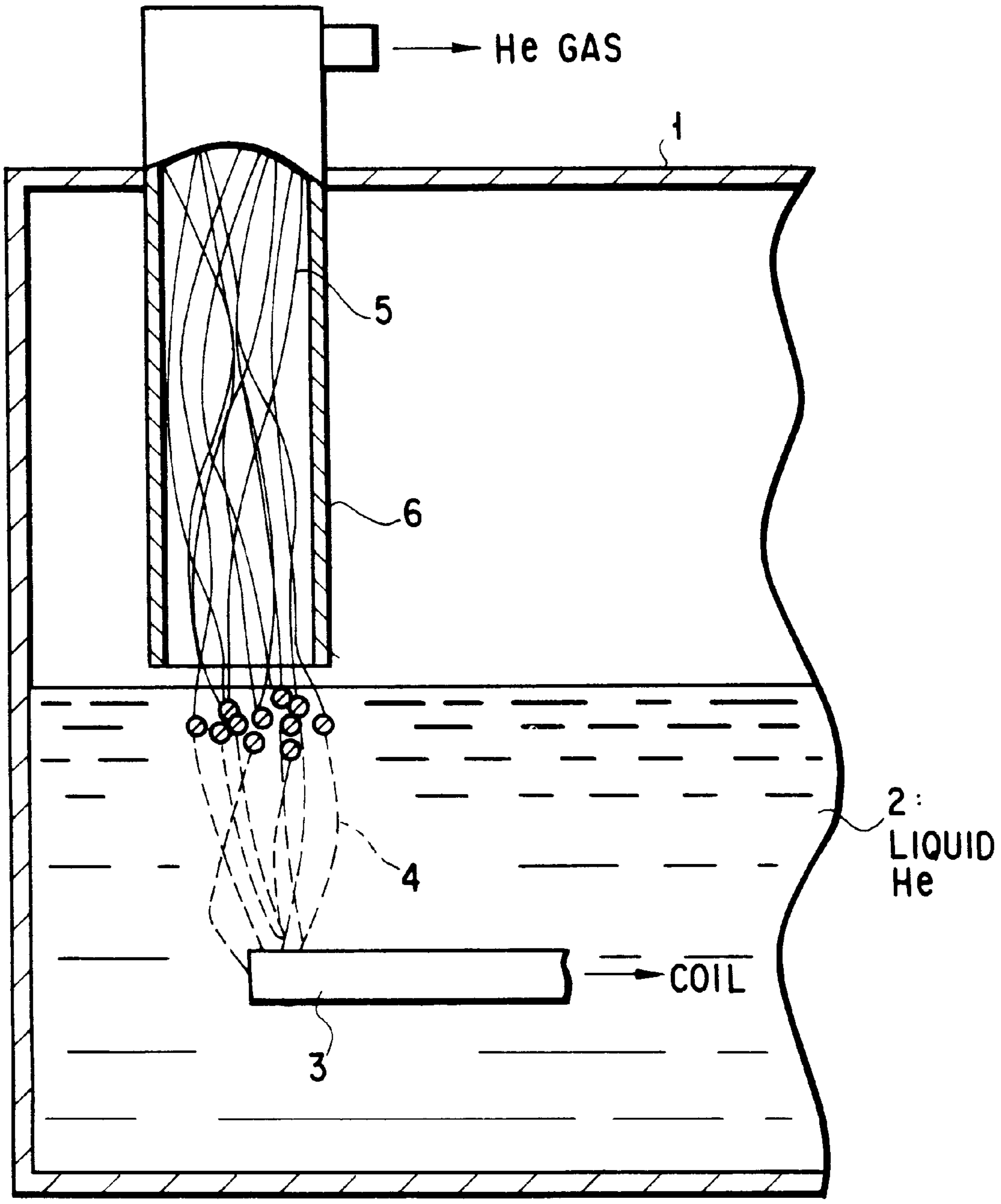
F I G. 1 (PRIOR ART)
FIG. 1 shows a conventional gas-cooled current lead.
Figure 2:
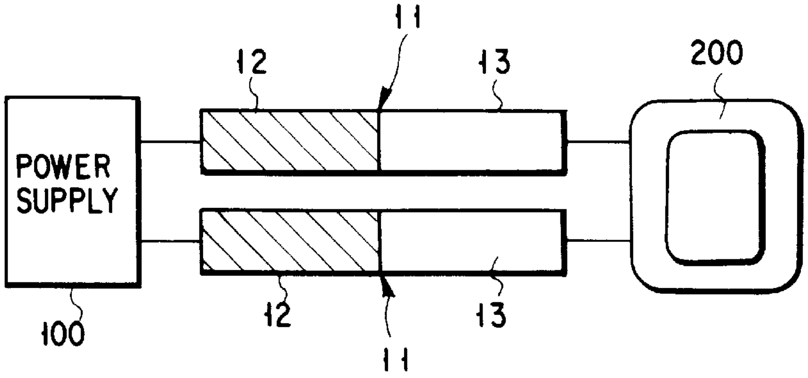
F I G. 2 (PRIOR ART)
FIG. 2 shows a conventional current lead for use with a superconducting coil.
Figure 3:
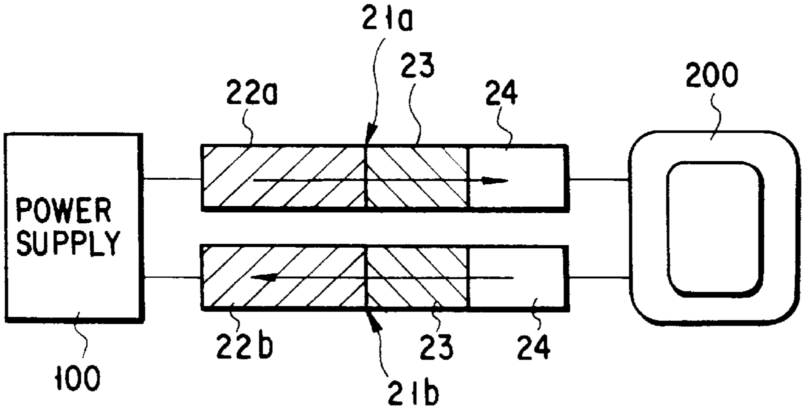
F I G. 3 (PRIOR ART)
FIG. 3 shows another conventional current lead for use with a superconductor coil.
Figure 4:
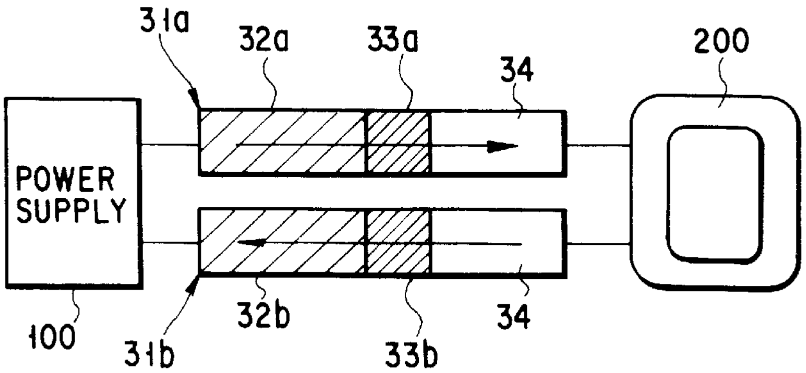
FIG. 4 shows a current lead which the present invention provides as being suitable for use with a superconducting coil.

An example of a current lead which the present invention provides as being suitable for use with a superconducting coil is shown in FIG. 4. Referring to this FIGURE, a power supply 100 placed in a room-temperature environment and a superconducting coil 200 placed in an ultralow-temperature environment are connected together by means of a first current lead 31_a_ and a second current lead 31_b_. The first current lead 31_a_ is made up of a room-temperature N-type thermoelectric semiconductor 32_a_ formed of a BiTe- or BiTeSb-based material, a low-temperature N-type thermoelectric semiconductor 33_a_ formed of a BiSb-based material, and a high-temperature superconductor 34 formed of a Bi-based material. These elements of the first current lead 31_a_ are jointed together. The second current lead 31_b_ is made up of a room-temperature P-type thermoelectric semiconductor 32_b_ formed of a BiTe- or BiTeSb-based material, a low-temperature P-type thermoelectric semiconductor 33_b_ formed of a BiSb-based material, and a high-temperature superconductor 34 formed of a Bi-based material. These elements of the second current lead 31_b_ are jointed together. In the current circuit formed by the first and second current leads, a current from the power supply 100 flows first through the first current lead 31_a_, then through the superconducting coil 200, then through the second current lead 31_b_, and then returns to the power supply 100.

How the current leads 31_a_ and 31_b_ of the present invention operate will be described. Let us assume that a current is made to flow through the room-temperature N-type and P-type thermoelectric semiconductors 32_a_ and 32_b_, as indicated by the arrows in FIG. 4. Due to the Peltier effect, the thermoelectric semiconductors 32_a_ and 32_b_ function as a heat pump, and heat is transmitted from the low-temperature region to the room-temperature region. Since the thermoelectric semiconductors are formed of a BiTe-based material or BiTeSb-based material, they can cool an object to as low as 200K or thereabouts in the state where there is no heat load. Let us also assume that that a current is made to flow through the low-temperature N-type and P-type thermoelectric semiconductors 33_a_ and 33_b_, as indicated by the arrows in FIG. 4. Due to the Peltier effect, the thermoelectric semiconductors 33_a_ and 33_b_ also function as a heat pump, and heat is transmitted from the low-temperature region to the room-temperature region. Since the thermoelectric semiconductors 33_a_ and 33_b_ are formed of a BiSb-based material, they can cool an object from 200K to 77K (i.e., the temperature of liquid nitrogen) in the state where there is no heat load. As a result, those portions of the current leads 31_a_ and 31_b_ which are located in the room-temperature region decrease in temperature, thus suppressing the heat which may be transmitted to the low-temperature region. Unlike the conventional current leads, the current leads of the present invention do not comprise a normal conductor having a high heat conductivity. Therefore, the present invention provides a solution to the problem of the prior art, wherein the heat transmitted through a normal conductor enters the system. In addition, since the heat conductivity of each thermoelectric semiconductor is about 1/200 of that of Cu, the heat flow to the ultralow-temperature region is suppressed even when no current is supplied.

The current leads shown in FIG. 4 can be regarded as being formed of a functionally gradient material wherein Bi serves as a base member. Therefore, the characteristics of the current leads can be continuously controlled by selecting the substance introduced into the Bi base member. To be more specific, the current leads include semiconductor and superconductor portions, and characteristics continuously vary between these portions.

Owing to the same principles as mentioned above, the heat flow to the ultralow-temperature region can be suppressed in the following two cases as well. In one of the cases, in the first current lead 31_a_, the low-temperature N-type thermoelectric semiconductor 33_a_ is located between the room-temperature N-type thermoelectric semiconductor 32_a_ and the high-temperature superconductor 34, while in the second current lead 31_b_, a normal conductor is located between the room-temperature P-type thermoelectric semiconductor 32_b_ and the high-temperature superconductor 34. In the other case, in the first current lead 31_a_, a normal conductor is located between the room-temperature N-type thermoelectric semiconductor 32_a_ and the high-temperature superconductor 34, while in the second current lead 31_b_, the low-temperature P-type thermoelectric semiconductor 33_b_ is located between the room-temperature P-type thermoelectric semiconductor 32_b_ and the high-temperature superconductor 34.

In the case where the low-temperature thermoelectric semiconductor and the high-temperature superconductor are joined directly to each other, the low-temperature thermoelectric semiconductor is required to exhibit a satisfactory cooling effect. If the cooling effect is not satisfactory, the heat may result in undesirable operations. In order to reliably prevent these, that end portion of the high-temperature superconductor which is closer to the room-temperature region may be cooled to a temperature which is lower than the temperature of liquid nitrogen.

As described above, the use of the current leads of the present invention is effective in remarkably reducing the amount of heat transmitted from the room-temperature region to the ultralow-temperature region.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. Current leads comprising a first current lead and a second current lead connecting a power supply placed in a room-temperature environment and a superconducting coil placed in an ultra-low-temperature environment so as to form a current circuit wherein a current from the power supply flows through the first current lead, the superconducting coil and the second current lead and returns to the power supply, wherein:

said first current lead comprises:

a room-temperature N-type thermoelectric semiconductor selected from the group consisting of $Bi_2Te_3$ including an N-type dopant and $(BiSb)_2Te_3$ including an N-type dopant, a low-temperature N-type thermoelectric semiconductor consisting of BiSb with an N-type dopant, and a Bi—Sr—Ca—Cu—O-based high-temperature superconductor; and said second current lead comprises:

a room-temperature P-type thermoelectric semiconductor selected from the group consisting of $(BiSb)_2Te_3$ including a P-type dopant and $(L3iSb)_2Te_3$ including a P-type dopant, a low-temperature P-type thermoelectric semiconductor consisting of BiSb with an N-type dopant, and a Bi—Sr—Ca—Cu—O-based high temperature superconductor.

2. The current leads according to claim 1, wherein said high-temperature superconductor is formed of a material selected from the group consisting of Bi-2223 and Bi-2212, both of which are Bi—Sr—Ca—Cu—O-based materials.

3. The current leads according to claim 1, wherein:

said high-temperature superconductor has a first end portion and a second end portion, the second end portion being closer to the superconducting coil than the first end portion; and the first end portion is kept at a temperature lower than that of liquid nitrogen.

4. The current leads according to claim 1, wherein the room-temperature thermoelectric semiconductor and low-temperature thermoelectric semiconductor of at least one of the first and second current leads are different in cross section and/or length.

* * * * *

UNITED STATES PATENT AND TRADEMARK OFFICE

CERTIFICATE OF CORRECTION

PATENT NO. : 6,069,395

DATED : May 30, 2000

INVENTOR(S): Sataro YAMAGUCHI et al.

It is certified that an error appears in the above-identified patent and that said Letters Patent is hereby corrected as shown below:

On the title page, item [73] is incorrect. The Assignee's name should be:

--[73] Assignee: The Director-General of the National Institute for Fusion Science, Toki, Japan--

Signed and Sealed this

Tenth Day of April, 2001

*Attest:*

Nicholas P. Godici

NICHOLAS P. GODICI

*Attesting Officer*

*Acting Director of the United States Patent and Trademark Office*